United States Patent [19]
Bard et al.

[11] Patent Number: 5,444,925
[45] Date of Patent: * Aug. 29, 1995

[54] FLUID TREATMENT APPARATUS AND METHOD

[75] Inventors: Steven L. Bard, Endwell; Jeffrey D. Jones, Newark Valley; Robert H. Katyl, Vestal; Ronald J. Moore, Binghamton; Oscar A. Moreno, Vestal, all of N.Y.

[73] Assignee: International Business Machines Corporation, Armonk, N.Y.

[*] Notice: The portion of the term of this patent subsequent to Dec. 9, 2010 has been disclaimed.

[21] Appl. No.: 164,502

[22] Filed: Dec. 9, 1993

Related U.S. Application Data

[63] Continuation of Ser. No. 911,610, Jul. 10, 1992, Pat. No. 5,289,639.

[51] Int. Cl.⁶ .............................................. F26B 9/00
[52] U.S. Cl. .................................. 34/638; 34/629; 34/643; 34/464
[58] Field of Search ................... 34/9, 12, 18, 60, 155, 34/160, 218, 620, 623, 629, 637, 638, 640, 643, 444, 459, 460, 461, 464; 134/64 R, 64 P, 122 R, 122 P, 199; 15/302; 118/63

[56] References Cited

U.S. PATENT DOCUMENTS 5,201,132  4/1993  Jacob ................................... 34/160

Primary Examiner—Denise Gromada
Attorney, Agent, or Firm—Bernard Tiegerman

[57] ABSTRACT

A new apparatus for treating substrates with fluids, as well as a corresponding fluid treatment method, is disclosed. The new apparatus includes a new configuration of fluid jet injectors which substantially overcomes the problem of dragout, in which fluid impinged upon an area of a substrate is retained on that area, preventing fresh fluid from reaching the impinged area. This new configuration also avoids imposing torques on substrates, and substantially reduces the need for rollers and guides for transporting substrates.

6 Claims, 5 Drawing Sheets

FLUID TREATMENT APPARATUS AND METHOD

CROSS-REFERENCES TO RELATED APPLICATIONS

This is a continuation of U.S. application Ser. No. 07/911,610 filed by Steven L. Bard, Jeffrey D. Jones, Robert H. Katyl, Ronald J. Moore and Oscar A. Moreno on Jul. 10, 1992 now U.S. Pat. No. 5,289,639.

TECHNICAL FIELD

This invention pertains generally to apparatuses and methods for treating a substrate with a fluid, i.e., a liquid or a gas.

DESCRIPTION OF THE PRIOR ART

In the fabrication of a variety of devices such as, for example, printed circuit boards, various fluid treatments are applied to corresponding substrates, including rinsing, drying, chemical etching and electrolytic processing. These fluid treatments have been carried out using dip tanks and various configurations of spray nozzles and fluid jet injectors.

Dip tanks, while useful, are disadvantageous because they require an undesirably large amount of time for mounting and unmounting substrates to and from racks or baskets which are submerged within the dip tanks. In addition, mass transfer within a dip tank is typically effected via diffusion, which is often too slow a process to be economic. For example, when used for substrate rinsing, a dip tank quickly becomes heavily laden with the material to be removed from a substrate, which reduces the diffusion rate within the dip tank, and thereby slows rinsing. In fact, dip tanks often become so heavily laden with removed material that further rinsing becomes impossible.

Spray nozzles are disadvantageous because, among other reasons, they serve to atomize a fluid, resulting in the evaporation of the fluid. As a consequence, undesirable chemical emissions are exacerbated and re-use of the fluid is precluded, both of which are uneconomic. In addition, because the sprays produced by spray nozzles typically fail to achieve fluid bearing action on the substrates being processed, these substrates must be transported to and from the sprays by rollers and guides positioned between the spray nozzles and the substrates. However, the presence of these rollers and guides is undesirable because, among other reasons, they produce nonuniformities in the spray action which results in, for example, nonuniform rinsing and etching. Moreover, because sprays quickly lose momentum, they often fail to achieve efficient fluid treatment of specific substrate areas, which limits processing rate and throughput. For example, sprays are often inefficient or ineffective in rinsing or drying specific substrate areas, such as the interiors of holes in substrates, because whatever fluid reaches such areas tends to be retained on or in these areas (a phenomenon called dragout), with relatively little fresh fluid reaching these areas. Moreover, sprays often re-deposit or re-position, rather than remove, debris on the substrate, which then requires the use of additional sprays. Consequently, the use of sprays often requires the use of an undesirably large amount of processing area, which is also uneconomic. While attempts have been made to orient sprays to achieve directionality and thereby overcome some of the above-mentioned disadvantages, these attempts have typically been accompanied by a torque being imposed upon the subtrate by the directed spray. This results in instabilities in the motion of the substrate, often causing jamming of the substrate in the corresponding processing equipment, resulting in damage to the substrate or equipment, which is undesirable and counterproductive.

The use of fluid jets in the fluid treatment of substrates is potentially advantageous because fluid jets exhibit directionality and therefore, in principle, are capable of overcoming the disadvantages of sprays. However, previous configurations of fluid jets have failed to overcome the problem of dragout, particularly in the case of substrates with holes. Moreover, these previous fluid jet configurations have also imposed torques on substrates, resulting in undesirable and counterproductive instabilities in the motions of substrates.

Thus, those engaged in the development of fluid treatment apparatuses and methods have long sought, thus far without success, fluid jet configurations which: (1) overcome the problem of dragout, particularly in the case of substrates with holes; (2) avoid imposing torques on substrates; and (3) substantially reduce the need for rollers and guides for transporting substrates, thereby substantially reducing the interference caused by such rollers and guides.

SUMMARY OF THE INVENTION

The invention involves a fluid treatment apparatus, and corresponding fluid treatment method, which substantially overcomes the problem of dragout, which avoids imposing torques on substrates and substantially reduces the need for rollers and guides for transporting substrates. In one embodiment of the inventive apparatus, at least one row of fluid jet injectors penetrates a surface of the apparatus, over which a substrate to be processed is transported via rollers positioned at the entrance edge and exit edge of the apparatus surface. The substrate is transported in a direction which is substantially parallel to an axis associated with the apparatus surface, extending from the entrance edge to the exit edge, and the row of fluid jet injectors is aligned transversely to this axis. During its transport, the substrate is positioned close enough to the apparatus surface so that the fluid jets emitted by the fluid jet injectors become immersed in a layer of spent fluid covering the surface, and therefore the emitted fluid jets constitute submerged fluid jets. Significantly, the row of fluid jet injectors is positioned closer to the entrance edge of the apparatus surface than to the exit edge. As a result, the resistance to fluid flow toward the exit edge, through the relatively long portion of the layer of spent fluid, is greater than the resistance to fluid flow toward the entrance edge, through the relatively short portion of the layer of spent fluid. Consequently, after the fluid jets emitted by the fluid jet injectors impinge upon the substrate, more than half the fluid associated with the fluid jets flows countercurrently toward the entrance edge, where it is vented via, for example, drain holes in the apparatus surface. Thus, dragout is substantially eliminated because fluid impinged upon the substrate is more readily removed after impingement, allowing fresh fluid to reach the substrate. In addition, the countercurrent flow prevents removed debris from being re-deposited or re-positioned on any portion of the substrate which has been impinged upon by the fluid jets. Moreover, the spent fluid layer and submerged fluid jets achieve a fluid bearing action on the substrate, reducing the need for rollers and guides, other than the rollers at the entrance edge and exit edge of the apparatus surface.

It must be noted that the substantial elimination of dragout via the invention enables the inventive fluid treatment apparatus to fluid treat substrates more efficiently than was previously possible. Thus, for example, the length of the inventive apparatus can now be much shorter than was previously possible, which is highly advantageous.

To avoid a torque on a substrate which might be imposed by the use of one row of fluid jets, the inventive apparatus preferably includes two surfaces, with each containing one or more rows of fluid jet injectors, between which a substrate to be processed is transported. Here, the fluid jets which impinge upon the upper and lower surfaces of the substrate substantially balance each other, thereby substantially eliminating torques.

In another embodiment of the invention, intended to even more completely eliminate dragout in substrates with holes, the inventive apparatus again includes two surfaces, with each surface containing one or more rows of fluid jet injectors, between which a substrate is to be transported. Each row of fluid jet injectors on one surface is aligned with a corresponding row of fluid jet injectors on the other surface. However, the fluid jet injectors of a row on one surface are offset relative to the fluid jet injectors of the corresponding row on the other surface so that if one were to project the former fluid jet injectors onto the latter surface, the former fluid jet injectors would be interdigitated with the latter fluid jet injectors. This interdigitation of the fluid jet injectors ensures that the fluid jets which penetrate the holes in the substrate are unopposed by counteracting fluid jets.

In yet another embodiment of the invention, the above-described countercurrent flow is achieved by providing at least two rows of fluid jet injectors on an apparatus surface over which a substrate is to be transported. Significantly, at least the second row of fluid jet injectors is inclined toward the entrance edge of the surface. As a result, the fluid jets emanating from the second row of fluid jet injectors induce more than half the fluid associated with the fluid jets emanating from the first row of fluid jet injectors to flow toward the entrance edge of the apparatus surface, after impingement upon the substrate.

BRIEF DESCRIPTION OF THE DRAWINGS

The invention is described with reference to the accompanying drawings, wherein.

DESCRIPTION OF THE PREFERRED EMBODIMENT

The invention involves a fluid treatment apparatus, and a corresponding fluid treatment method, which substantially overcomes the problem of dragout, which avoids imposing torques on substrates and substantially reduces the need for rollers and guides for transporting substrates. These goals are achieved, in accordance with the invention, by employing a new configuration of fluid jet injectors in the inventive apparatus, producing a new configuration of fluid jets which impinge upon substrates undergoing fluid treatment, as more fully described below.

Figures 1, 2:
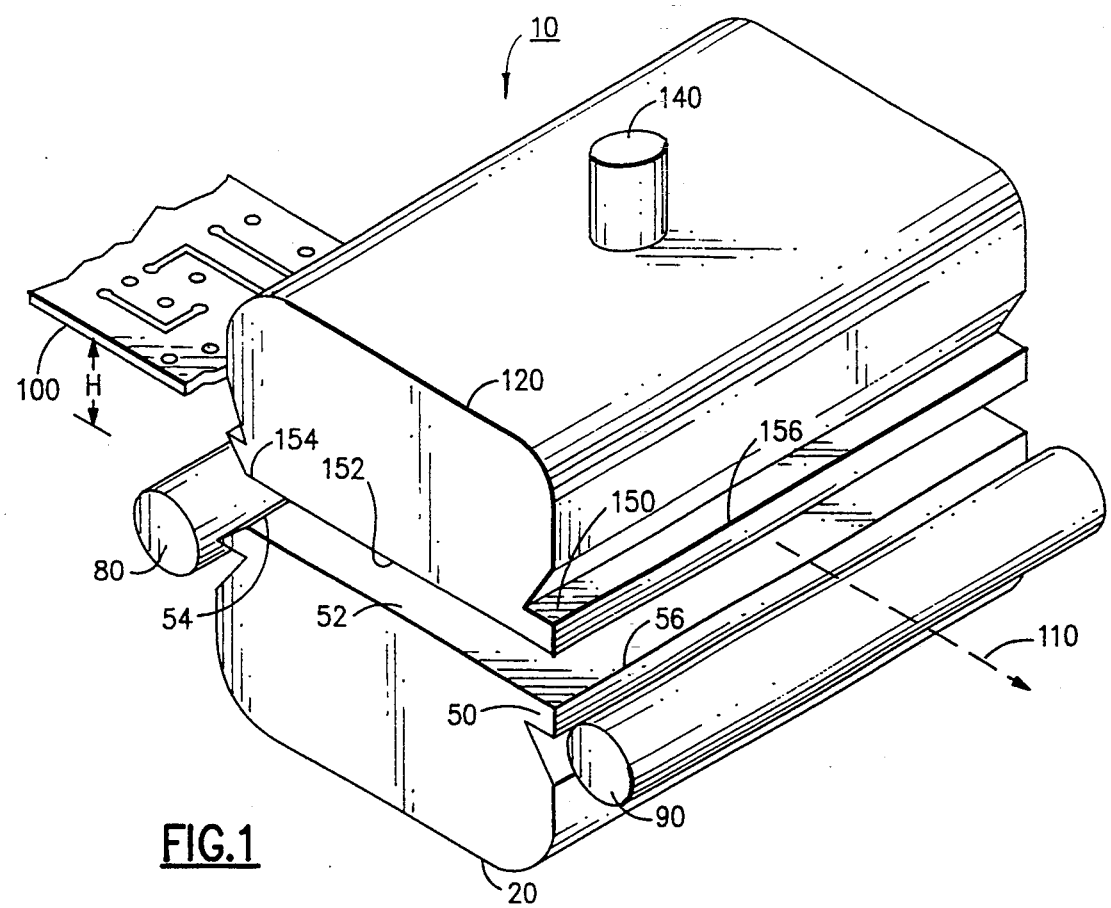
FIG. 1 is an isometric view of a first embodiment of the inventive apparatus.
FIG. 2 is an end view of the embodiment shown in FIG. 1.

With reference to FIGS. 1 and 2, a first embodiment of the inventive fluid treatment apparatus 10 includes at least one plenum housing 20 made, for example, of stainless steel, which contains a plenum chamber 30 into which a fluid is fed under pressure via a feed tube 40. The plenum housing 20 is topped by a connected injector plate 50 made, for example, of aluminum. Significantly, at least one row 60 of at least two, spaced-apart, drilled holes extends from the plenum chamber 30 to the surface 52 of the injector plate 50, which holes serve as fluid jet injectors.

As shown more clearly in FIG. 1, the inventive apparatus 10 also includes rollers 80 and 90 which serve to transport a substrate 100, e.g., a printed circuit board substrate, at a distance, H, from the surface 52, from an entrance edge 54 to an exit edge 56 of the surface 52. This transport of the substrate 100 occurs along a direction which is substantially parallel to an imaginary axis 110 associated with the surface 52, which axis is oriented transversely to the entrance and exit edges 54 and 56, and extends from the entrance edge 54 to the exit edge 56, and beyond.

While not shown in FIGS. 1 or 2, the inventive apparatus 10 preferably also includes side walls in flush contact with the flat end faces of the plenum housing 20, which side walls serve to confine the fluid emitted by the fluid jet injectors.

Figure 3:
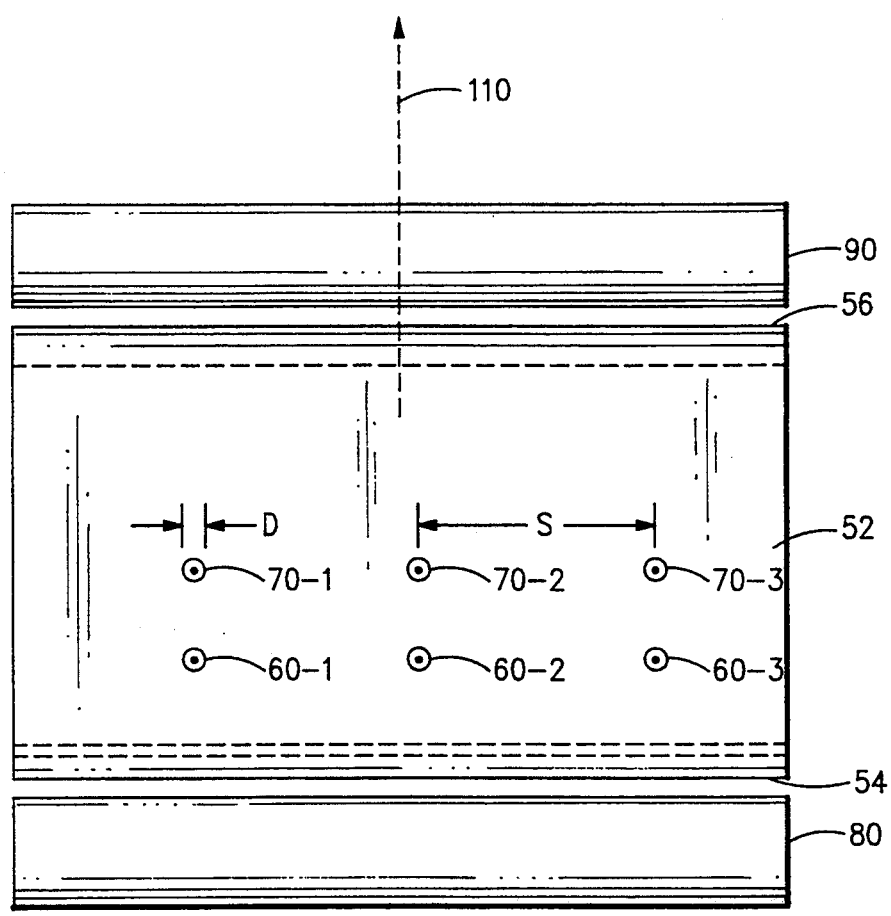
FIG. 3 is a top view of the embodiment shown in FIG. 1.

With reference now to FIG. 3, the at least one row 60 of fluid jet injectors includes the fluid jet injectors 60-1, 60-2, 60-3, etc., with the row 60 being inclined transversely to the imaginary axis 110. Preferably, each of the fluid jet injectors is of equal diameter, D, which ranges from about 5 mils (0.005 inches) to about 250 mils (0.25 inches). Fluid jet injectors having diameters smaller than about 5 mils are undesirable because they are difficult to fabricate. On the other hand, fluid jet injectors having diameters greater than about 250 mils are undesirable because they require an undesirably large amount of pump pressure to produce fluid jets.

With reference to FIG. 2, the drilled holes which constitute the fluid jet injectors are preferably all of equal length, L. In this regard, the ratio L/D preferably ranges from about 0.5 to about 40. Ratios less than about 0.5 are undesirable because they result in poorly developed fluid jets. Ratios greater than about 40 are undesirable because the corresponding fluid jet injectors are difficult to fabricate and require an undesirably large amount of pump energy to achieve a useful flow rate.

With reference once again to FIG. 3, the fluid jet injectors are preferably equidistantly spaced, with the center-to-center spacing between adjacent fluid jet injectors being denoted by S. The ratio S/D is necessarily greater than one (a ratio S/D=1 implies the fluid jet injectors are touching) but is preferably equal to or less than about 20. Ratios greater than about 20 are undesirable because after the corresponding fluid jets impinge upon the substrate 100, it has been found that the resulting fluid flows separate from the surface of the substrate 100 and form a region of recirculating fluid, which permits undesirable re-deposition of debris or spent fluid.

With reference to FIG. 1, as noted above, the fluid jets injected by the fluid jet injectors are to be submerged fluid jets, i.e., the fluid jets are to be injected into a layer of spent fluid covering the surface 52 and substantially filling the space between the surface 52 and the substrate 100. Such submerged fluid jets are achieved, in accordance with the invention, by bringing the substrate 100 into proximity with the surface 52 so that the ratio H/D ranges from about 0.2 to about 15. Ratios smaller than about 0.2 are undesirable because the substrate 100 is then so close to the surface 52 that the substrate is likely to become jammed against the surface 52. On the other hand, ratios greater than about 15 are undesirable because the substrate 100 is then so far from the fluid jet injectors that the corresponding fluid jets lose an undesirably large amount of momentum before impinging upon the substrate 100.

It should be noted that the spent fluid layer and fluid jets achieve a fluid bearing action on the subsrate 100. As a consequence, the need for rollers and guides between the entrance edge 54 and the exit edge 56 for transporting the substrate 100 is eliminated.

Because the fluid jet injectors are preferably all of equal diameter, D, and are all connected to the same plenum chamber 30, the fluid supplied to each of the fluid jet injectors is necessarily the same, and the speed of the fluid jets emanating from the fluid jet injectors is necessarily also the same. If the kinematic viscosity of the supplied fluid is denoted by nu and the speed of the fluid jets at the fluid jet injectors is denoted by V, then the Reynolds number associated with each of the fluid jets, defined as the ratio V*D/nu, preferably ranges from about 50 to about 30,000. Reynolds numbers less less than about 50 are undesirable because the corresponding fluid jets have undesirably small momenta. On the other hand, Reynolds numbers greater than about 30,000 are undesirable because the achievement of such high Reynolds numbers requires undesirably high plenum pressures.

In accordance with the invention, and as noted above, the row 60 of fluid jet injectors is positioned closer to the entrance edge 54 (see FIG. 3) of the surface 52 than the exit edge 56. As a result, in the operation of the apparatus 10, the resistance to fluid flow from the row 60 toward the exit edge 56, through the relatively long portion of the layer of spent fluid covering the surface 52, is relatively high. By contrast, the resistance to fluid flow from the row 60 toward the entrance edge 54, through the relatively short portion of the layer of spent fluid covering the surface 52, is relatively low. Consequently, after the fluid jets emitted by the row 60 of fluid jet injectors impinge upon the substrate 100, more than half the fluid associated with the fluid jets flows counter-currently toward the entrance edge 54. Thus, undesirable dragout and re-positioning of debris is substantially reduced or eliminated.

Although not shown in the drawings, the injector plate 50 preferably includes a row of drain holes positioned adjacent the entrance edge 54, aligned transversely to the imaginary axis 110. These drain holes permit ready venting of the above-described countercurrently flowing fluid. Moreover, if a pump is used to pump fluid out of the drain holes, then the countercurrent flow is enhanced.

Preferably, although not shown in the drawings, the injector plate 50 also includes a row of drain holes positioned adjacent the exit edge 56, aligned transversely to the imaginary axis 110. These additional drain holes serve to vent the relatively small amount of fluid which flows toward the exit edge.

As shown in FIGS. 2 and 3, the first embodiment of the inventive apparatus 10 preferably includes a second row 70 of fluid jet injectors, penetrating the surface 52, aligned transversely to the imaginary axis 110. Significantly, this second row 70 of fluid jet injectors, which includes fluid jet injectors 70-1, 70-2, 70-3, etc., is positioned between the row 60 of fluid jet injectors and the exit edge 56, and is preferably equidistantly positioned between the entrance edge 54 and the exit edge 56. By virtue of the presence of the fluid jets emitted by the second row 70, the above-described countercurrent flow associated with the fluid emitted by the first row 60 is enhanced.

To avoid imposing a torque on the substrate 100, and as depicted in FIGS. 1 and 2, the first embodiment of the inventive apparatus 10 preferably includes a second plenum housing 120, containing a plenum chamber 130 into which fluid is fed under pressure via a feed tube 140. An injector plate 150 is mounted on the plenum housing 120, with rows 160 and 170 of fluid jet injectors extending from the plenum chamber 130 to the surface 152 of the injector plate 150. The fluid jets emitted by the rows 160 and 170, which impinge upon the upper surface of the substrate 100, serve to counterbalance the fluid jets emitted by the rows 60 and 70, which impinge upon the lower surface of the substrate 100. As a result, undesirable torques on the substrate 100 are avoided.

Figure 4:
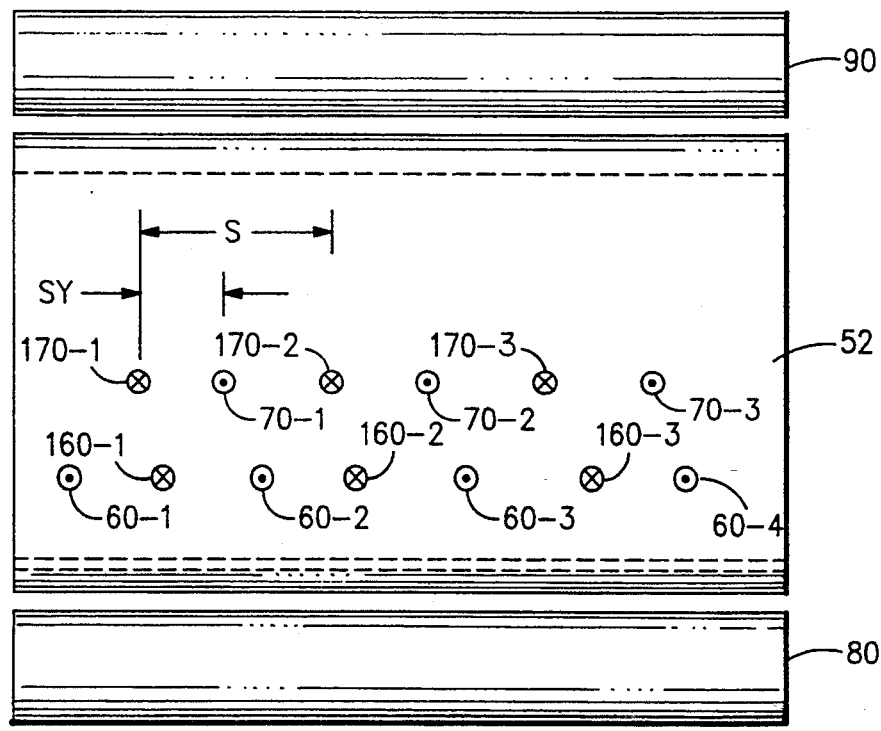
FIG. 4 is a top view of a second embodiment of the inventive apparatus.
Figure 5:
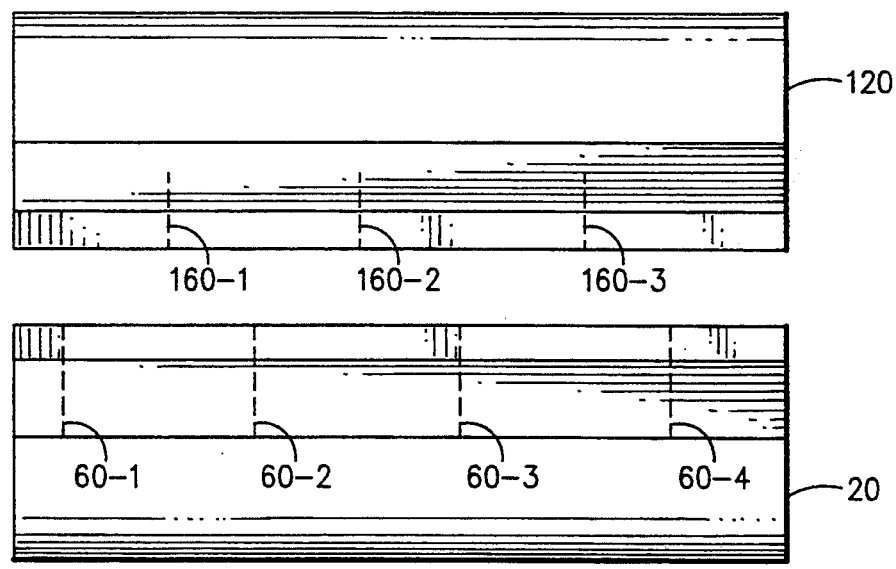
FIG. 5 is a front view of the second embodiment of FIG. 4.

With reference now to FIGS. 1, 4 and 5, a second embodiment of the inventive apparatus 10 is generally similar to the first embodiment. This second embodiment definitely includes both the plenum housing 20 and the plenum housing 120, and the surfaces 52 and 152 define a channel having an entrance adjacent the entrance edges 54 and 154 and an exit adjacent the exit edges 56 and 156. This channel is characterized by an axis which is oriented transversely to the entrance and exit edges 54,154,56 and 156, and extends from the entrance of the channel to the exit of the channel.

In connection with the second embodiment, the substrate 100 is transported via rollers 80 and 90 through the above-defined channel in a direction which is substantially parallel to the channel axis. This transport occurs at a distance, H1, above the surface 52 and at a distance, H2, below the surface 152. The distances H1 and H2 need not be the same.

As shown in FIGS. 4 and 5, the second embodiment includes at least one row 60, and preferably two rows 60 and 70, of fluid jet injectors penetrating the surface 52. The fluid jet injectors of the rows 60 and 70 are of equal diameter, D1, and the fluid jets which they emit exit the fluid jet injectors with fluid speed V1. The fluid in these fluid jets is characterized by a kinematic viscosity nu1. Preferably, the row 60 is positioned closer to the entrance edge 54 than to the exit edge 56, for the reason discussed above.

The second embodiment also includes at least one row 160, and preferably two rows 160 and 170, of fluid jet injectors penetrating the surface 152. The fluid jet injectors of the rows 160 and 170 are of equal diameter D2, and the fluid jets which they emit exit the fluid jet injectors with fluid speed V2. The fluid in these fluid jets is characterized by a kinematic viscosity nu2. The diameter D2 is not necessarily equal to the diameter D1, the kinematic viscosity nu2 is not necessarily equal to the kinematic viscosity nu1, and the fluid speed V2 is not necessarily equal to the fluid speed V1.

In the second embodiment, like the first embodiment, the ratios H1/D1, H2/D2, V1*D1/nu1 and V2*D2/nu2 fall within the ranges given above, for the reasons given above.

As shown more clearly in FIG. 4, the second embodiment differs from the first embodiment in that the row 160 is shifted relative to the row 60 so that if the row 160 were to be projected onto the surface 52 (as depicted in FIG. 4), the fluid jet injectors of the row 160 would be interdigitated with the fluid jet injectors of the row 60. The row 170 is similarly shifted relative to the row 70. The purpose of these shifts is to ensure that fluid jets which penetrate holes in the substrate 100 are unopposed by counteracting fluid jets, which substantially eliminated dragout in such hole.

The amount of the above-described shift, denoted Sy, is chosen so that the ratio Sy/S is greater than 0 but less than 1. Ratios equal to 0 and 1 imply an absence of interdigitation.

It should be noted that the second embodiment has been found to be particularly useful in rinsing substrates having holes.

Figure 6:
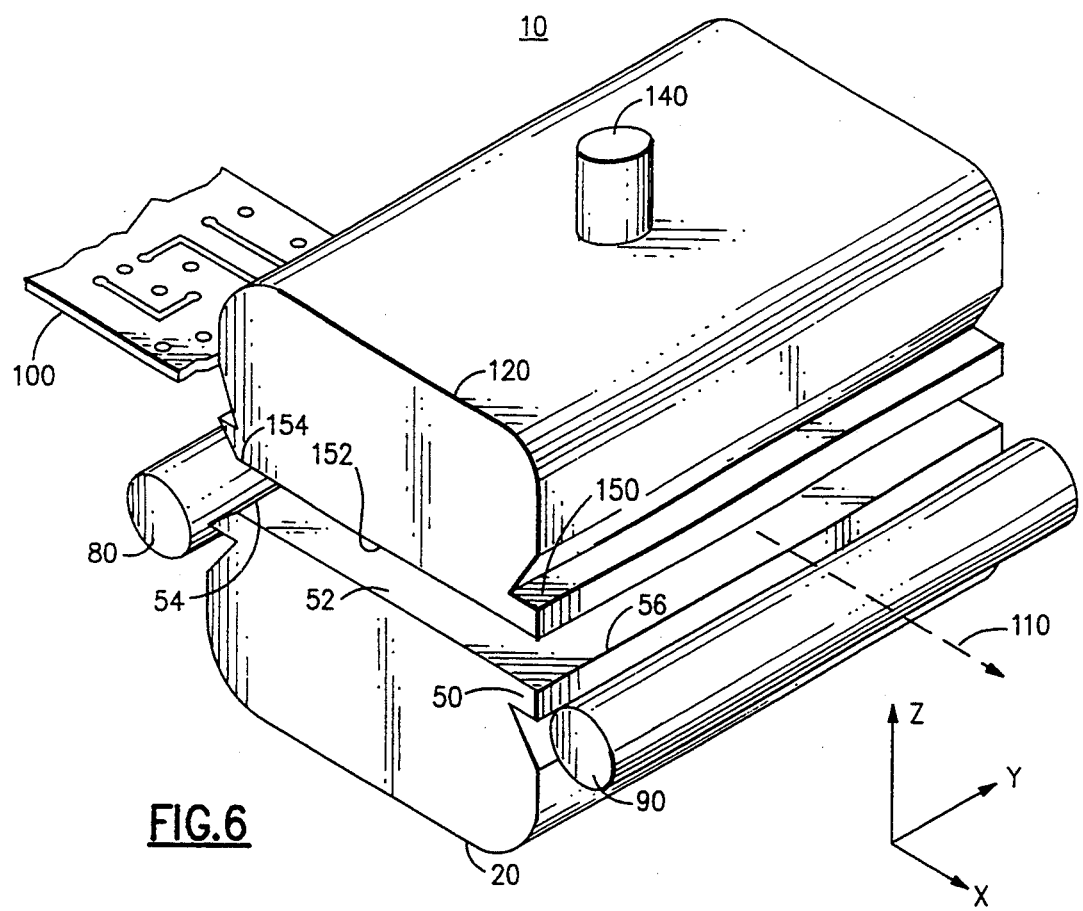
FIG. 6 is an isometric view of a third embodiment of the inventive apparatus.

With reference now to FIGS. 6, 7, 8 and 9, a third embodiment of the inventive apparatus is generally similar to the first and second embodiments, and is characterized by a coordinate system x,y,z, as pictured in FIG. 6. As shown, the x-axis is parallel to the axis 110 associated with the surface 52, here referred to as the transport axis. The y-axis lies in a least-squares-fit planar approximation to the surface 52 and is perpendicular to the x-axis. The z-axis is perpendicular to both the x-axis and the y-axis.

The third embodiment differs from the second embodiment in that each of the fluid jet injectors in row 70 is inclined toward the entrance edge 54. Moreover, each of these fluid jet injectors forms an angle, theta, with the z-axis, as measured in the counterclockwise direction in a plane defined by the z-axis and x-axis, which is greater than 0 degrees but less than 90 degrees. Such an inclination, and range of angles, theta, enhance the countercurrent flow associated with the fluid emitted by the fluid jet injectors in the row 60, discussed above.

Preferably, the fluid jet injectors in the row 70 are also inclined toward the y-axis. Moreover, each such inclined fluid jet injector forms an angle, phi, with the z-axis, as measured in the clockwise direction in a plane defined by the z-axis and the y-axis, which is greater than 0 degrees but less than 90 degrees. This y-axis inclination is advantageous because it induces the fluid emitted by the fluid jet injectors in the row 60, after impingement upon the substrate 100, to flow laterally in the direction of the y-axis, which also serves to eliminate dragout.

Figure 7:
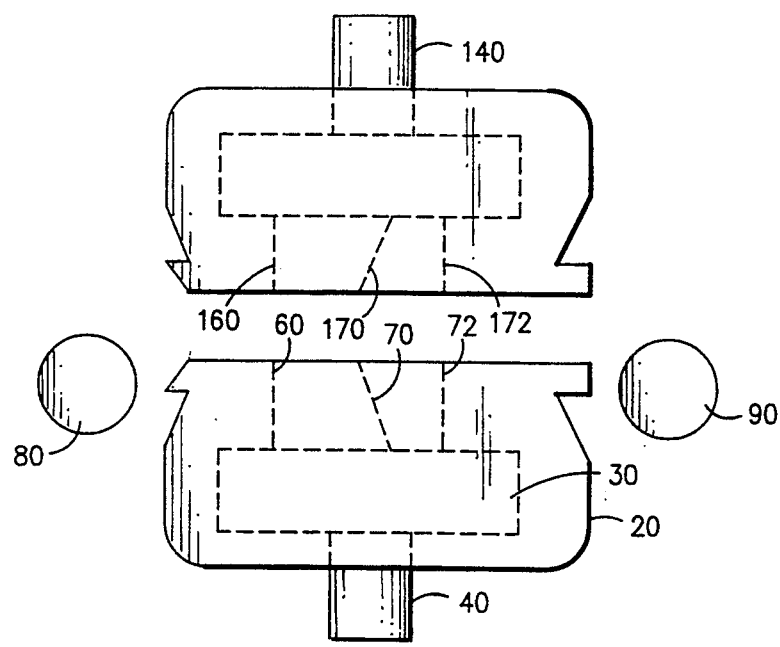
FIG. 7 is an end view of the embodiment shown in FIG. 6.
Figure 8:
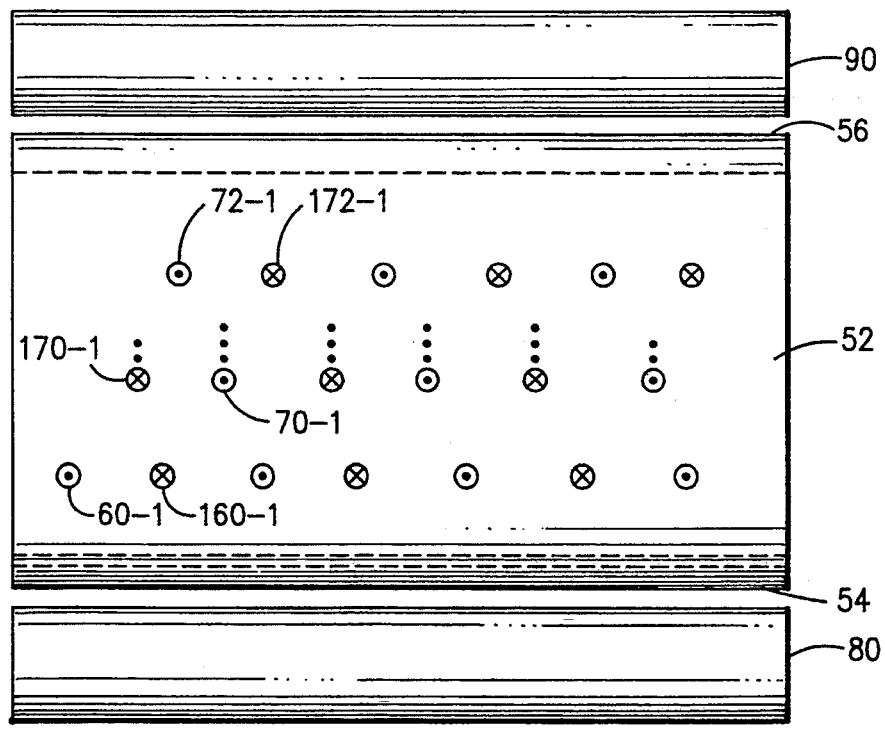
FIG. 8 is a top view of the embodiment shown in FIG. 6.
Figure 9:
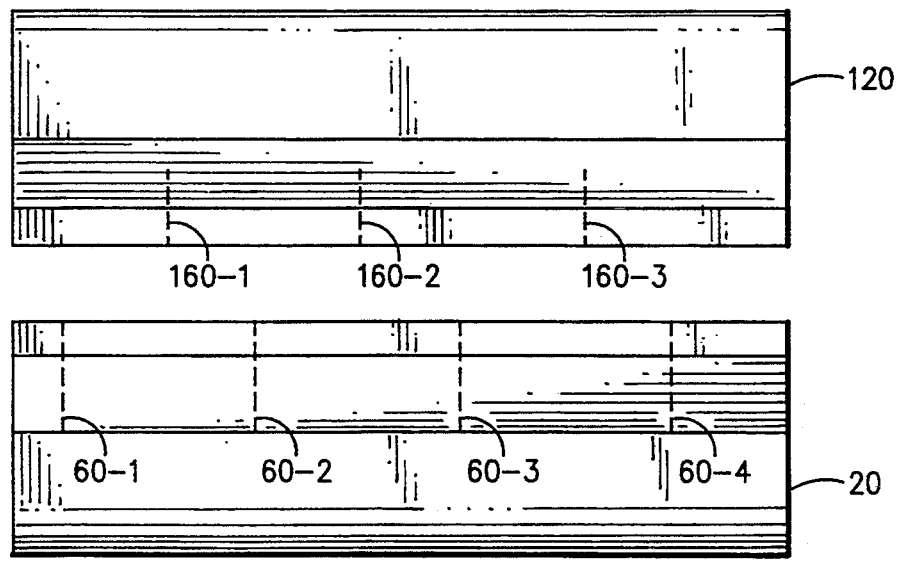
FIG. 9 is a front view of the embodiment shown in FIG. 6.

As shown in FIGS. 7 and 8, the third embodiment also includes a row 72 of fluid jet injectors penetrating the surface 52. This third row is advantageous because the corresponding fluid jets serve to stabilize the motions of substrates, particularly relatively thin substrates.

As also shown in FIGS. 7 and 8, the surface 54 is penetrated by rows 160, 170 and 172 of fluid jet injectors, which mirror the rows 60, 70 and 72 penetrating the surface 52.

It should be noted that the third embodiment has been found to be particularly advantageous in drying substrates with holes.

While the invention has been particularly shown and described with reference to preferred embodiments thereof, it will be understood by those skilled in the art that various changes in form and details may be made therein without departing from the spirit and scope of the invention.

Example 1

Rinsing of circuit boards was compared using a standard spray rinse vs. the invention apparatus. The comparison looked at conveyor length used for rinsing, electricity usage, flow rate of rinse water used, and resultant ionic contamination on the circuit boards.

For both parts of the experiment, one or two DSM (double spray modules), horizontally conveyorized wet 0.10" and the distance, H2, of the upper surface of the device from the top of the substrate was 0.25". The rinsing fluid, water, having a viscosity, nu, of 0.01 cm**2/sec, was passed through each of the injectors with a velocity V of 302 cm/sec, giving a Reynolds number, Re, of about 2300.

Each apparatus pair had at its entrance and exit side a pair of solid cylindrical "squeegee" conveyor rollers and was provided with a pump and sump. The water was re-circulated from each respective sump to the respective apparatus, after which the water would fall back into the sump. At the same time, incoming water caused the sump water to cascade continuously to the stage preceding and finally to waste treatment. By "stage preceding", it is meant the stage through which the circuit board would travel immediately prior to the current stage. The water cascaded from stage to stage in the opposite direction to the direction of circuit board travel. This arrangement of water cascade direction relative to product travel direction, is known as "counter-current rinsing" in the art, is the most efficient in terms of both overall water usage and cleanliness of the final rinse, and was used in both the spray and invention apparatus tests.

Each run consisted of ten circuit boards measuring 10×15×0.060 inches and having a mixture of 0.050 inch and 0.018 inch diameter holes. There were copper traces on epoxy dielectric on the surface. The circuit boards were run at .120 inches per minute through a microetch chamber, followed by the rinse, and air dried. The microetch consisted of approx. 40 g/l sodium persulfate and 40 g/l sulfuric acid dissolved in water. Resultant contamination was measured using an Omega ionograph meter which had been calibrated to give conductivity readings in equivalent NaCl contamination in micrograms/square inch of circuit board.

Water usage was measured with a float-type see-through flowmeter, and power usage was determined with a hand-held current meter.

|                                  | Results                                                    |                           |                                  |
| Fluid Delivery Device | Water usage gal/min | Ionic contamination on product micro g/sq.in. (NaCl equivalent) | Conveyor length feet | Electrical Usage Kilowatts |
| --- | --- | --- | --- | --- |
| Spray (2-stage) | 5 | 1.4 | 4 | 2.7 |
| Invention Apparatus (4-stage) | 1 | 1.7 | 2 | 1.6 |

As can be seen from the data, the invention showed an essentially equivalent contamination level while using 40% less electricity (four smaller pumps feeding the apparatuses of the invention used less electricity than the two larger pumps feeding the sprays) and generating 80% less water waste by volume, all in 50% less conveyor space than the standard spray system. As far as water usage is concerned, let it be noted that theoretically a four-stage spray rinse could use just as small an amount of water as a four-stage rinse incorporating the invention apparatus. However, such a four-stage spray rinse would occupy four times as much conveyor space and would consume three and one-third times as much electricity as the invention apparatus.

Example 2

Drying of circuit boards was compared using the invention apparatus versus two state-of-the art dryers. Comparison results were measured for both high and normal aspect-ratio thru-holes in terms of electricity usage and conveyor length.

The state-of-the-art dryer used as a basis of comparison for hi-aspect ratio thru-holes was a SHD ("small hole dryer") built by International Supplies of Parma, Italy. Circuit boards run through this machine were approximately 0.300 inches thick and 24×28 inches in width and length with thousands of approx. 0.015 inch dia. thru-holes. The dryer used four "push-pull" slotted manifolds run by a turbine blower that forced pressurized air against one side of the circuit board and suction to the opposing side. The push-pull was alternated so that the pressure side alternated up, down, up and then down. Following the forced-air slotted blowers were two heated fan blowers that recirculated hot air. When the circuit boards were conveyed through this configuration at 1 meter/minute, many of the thru-holes were still wet, leading to unwanted stains that were deleterious in subsequent processes. A single pair of the invention apparatuses with the preferred drying embodiment as shown in FIGS. 6–9 were installed with a turbine blower feeding each side.

The apparatus pair for the drying embodiment was characterized by two surfaces with an an entrance-to-exit length of 2.25". Three rows, each containing 171 0.043" dia. injectors, were placed in both the upper and lower surfaces at distances from the entrance edge of the device of, respectively, 0.500", 0.650", and 1.125". The injectors in the upper and lower surfaces, respectively, were made by drilling holes through 0.3" and 0.5" thick aluminum metal. Center-to-center spacing of the 0.043" dia. injector holes within each of the four rows was 0.150". The injectors in the first, second and third rows in the upper surface were positioned so that their vertical projection onto the lower surface was centered between the injectors in the first, second, and third rows in the lower surface, respectively. The y-position of the injectors in the second and third rows in each surface was offset from the y-position of the injectors in the adjacent first row by 0.050" and 0.100", respectively. An 18 degree beveling of the first 0.375" of the upper and lower surfaces served as a guide for the substrates. The injectors in the upper and lower surfaces were drilled at a 15 degree angle so that jets issuing from them were tilted towards the entrance of the device. The distance, H1, of the lower surface from the bottom of the substrate was 0.050" and the distance, H2, of the upper surface of the device from the top of the substrate was 0.250". The drying fluid was air having a viscosity, nu, of 0.17 cm**2/sec, and was passed through each of the injectors with a velocity V of 9000 cm/sec, giving a Reynolds number, Re, of about 5800.

With the invention installed, at 1 meter/min conveyor speed, and with the two heated blowers off, all of the thru-holes were dry.

The state-of-the-art dryer used as a basis of comparison for normal aspect-ratio thru-holes was a "TMDM" dryer built by Chemcut of State College, Pennsylvania. Circuit boards run through this machine were approximately 0.060 inch thick and 10×15 inches in width and length. The dryer used several different blowers and manifolds and also used a heated rinse with the intent to allow the water retained on the panel to dry more rapidly. When panels were sent through this machine at 2 meters/minute they dried sufficiently, but when they were sent through at 3 meters/minute they still had wet spots. In comparison, the same drying apparatus pair used in the hi-aspect ratio tests above dried the panels completely at 3 meters/minute conveyor speed.

To qualitatively test the amount of air venting from the entrance of the device vs. from the exit, a strip of paper was held vertically immediately before and behind the apparatus. Using this method, it was noted that a strong positive flow of air issued from the device entrance, but that a neutral if not slightly negative flow of air was issuing from the device exit. In other words, it appeared that air was actually being sucked into the exit side of the device, probably due to Bernoulli effects. From these observations, it is clear that the invention produces an exceptionally good counter-current flow of air against the travelling substrate, which is also advantageous to efficient drying.

A summary of the drying comparison follows:

|  | Conveyor length feet | Electrical Usage Kilowatt |
| --- | --- | --- |
| Low aspect-ratio |  |  |
| State-of-the art | 4 | 10 |
| Invention Apparatus | .5 | 4 |
| High aspect-ratio |  |  |
| State-of-the art | 5.5 | >15 |
| Invention Apparatus | .5 | 4 |

As can be seen, all other things being equal, the invention is very economical in terms of both conveyor space and electrical usage. The fact that heated air is not needed is also a plus since this reduces the risk of oxidation of the copper traces on the circuit boards.

We claim:

1. Fluid treatment apparatus, comprising:
   at least a first surface, of finite dimensions, including an entrance edge and an exit edge and characterized by an axis extending from said entrance edge to said exit edge; and means for transporting a substrate over said surface at a distance, H, from said surface, from said entrance edge to said exit edge along a direction which is substantially parallel to said axis, Characterized In That said apparatus further comprises at least a first row of at least two spaced-apart fluid jet injectors, which first row is aligned transversely to said axis and which at least two fluid jet injectors penetrate said surface, a center-to-center spacing between said at least two fluid jet injectors being denoted by S, each of said fluid jet injectors including a hole of diameter D and length L, with the ratio L/D ranging from about 0.5 to about 40 and with the ratio S/D being greater than 1 but less than or equal to 20, and wherein said at least two fluid jet injectors serve to produce a first row of at least two fluid jets which impinge upon said substrate, each of said fluid jets being characterized by a fluid speed, V, at said fluid jet injectors, and the fluid of said fluid jets being characterized by a kinematic viscosity, nu, and wherein a Reynolds number associated with each of said fluid jets, defined as the ratio V*D/nu, ranges from about 50 to about 30,000.

2. The fluid treatment apparatus of claim 1, wherein the ratio H/D ranges from about 0.2 to about 15.

3. The fluid treatment apparatus of claim 1, wherein D ranges from about 5 mils to about 250 mils.

4. A method for treating a substrate with a fluid, comprising the steps of:

transporting said substrate over a surface, of finite dimensions, including an entrance edge and an exit edge and characterized by an axis extending from said entrance edge to said exit edge, said transporting being carried out at a distance, H, from said surface, from said entrance edge to said exit edge, along a direction which is substantially parallel to said axis; and impinging at least a first row of at least two fluid jets upon said substrate, emanating from a first row of at least two, spaced-apart fluid jet injectors characterized by a center-to-center spacing denoted by S, said first row of fluid jet injectors being aligned transversely to said axis and penetrating said surface, and therefore said first row of fluid jets is aligned transversely to said axis, each of said fluid jet injectors including a drilled hole of diameter D and length L, with the ratio L/D ranging from about 0.5 to about 40 and with the ratio S/D being greater than 1 but less than or equal to 20, and wherein each of said fluid jets is characterized by a fluid speed, V, at said fluid jet injectors and the fluid of said fluid jets is characterized by a kinematic viscosity nu, and wherein a Reynolds number associated with each of said fluid jets, defined as the ratio V*D/nu, ranges from about 50 to about 30,000.

5. The method of claim 4, wherein the ratio H/D ranges from about 0.2 to about 15.

6. The method of claim 4, wherein D ranges from about 5 mils to about 250 mils.

* * * * *